US010250229B2

(12) United States Patent
Noguchi

(10) Patent No.: US 10,250,229 B2
(45) Date of Patent: Apr. 2, 2019

(54) ELASTIC WAVE APPARATUS

(71) Applicant: Murata Manufacturing Co., Ltd., Nagaokakyo-shi, Kyoto-fu (JP)

(72) Inventor: Akira Noguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/695,063

(22) Filed: Sep. 5, 2017

(65) Prior Publication Data

US 2018/0083600 A1     Mar. 22, 2018

(30) Foreign Application Priority Data

Sep. 20, 2016   (JP) ................................. 2016-182870

(51) Int. Cl.
| | |
|---|---|
| *H03H 9/70* | (2006.01) |
| *H03H 9/72* | (2006.01) |
| *H03H 9/54* | (2006.01) |
| *H03H 9/64* | (2006.01) |
| *H03H 9/60* | (2006.01) |
| *H03H 9/05* | (2006.01) |
| *H03H 9/58* | (2006.01) |

(52) U.S. Cl.
CPC .......... *H03H 9/605* (2013.01); *H03H 9/0557* (2013.01); *H03H 9/0566* (2013.01); *H03H 9/0576* (2013.01); *H03H 9/6483* (2013.01); *H03H 9/706* (2013.01); *H03H 9/725* (2013.01); *H03H 9/586* (2013.01); *H03H 9/6416* (2013.01)

(58) Field of Classification Search
CPC .. H03H 9/0557; H03H 9/0566; H03H 9/0571; H03H 9/0576; H03H 9/542; H03H 9/586; H03H 9/605; H03H 9/6416; H03H 9/6423; H03H 9/6483; H03H 9/706; H03H 9/725
USPC ................................. 333/133, 189, 193–195
See application file for complete search history.

(56) References Cited

U.S. PATENT DOCUMENTS

| | | | | | |
|---|---|---|---|---|---|
| 5,561,406 | A | * | 10/1996 | Ikata .................... | H03H 9/0576 333/126 |
| 5,859,473 | A | * | 1/1999 | Ikata .................... | H03H 9/0576 257/723 |
| 6,489,860 | B1 | * | 12/2002 | Ohashi ................. | H03H 9/0576 333/133 |
| 7,054,608 | B2 | * | 5/2006 | Yamakawa ......... | H01F 17/0013 333/134 |

(Continued)

FOREIGN PATENT DOCUMENTS

| | | |
|---|---|---|
| JP | 2012-156741 A | 8/2012 |
| JP | 2014-017537 A | 1/2014 |

*Primary Examiner* — Barbara Summons
(74) *Attorney, Agent, or Firm* — Keating & Bennett, LLP

(57) ABSTRACT

An elastic wave apparatus includes first and second bandpass filters and the first bandpass filter is a ladder elastic wave filter. The mounting substrate includes an inductor which is connected between at least one of parallel arm resonators and a ground potential, a signal wiring at a hot side, which is connected to the first bandpass filter, and a ground wiring. When the mounting substrate is viewed from a side of a surface on which the elastic wave filter chip is mounted, a portion of the inductor overlaps with a portion of the signal wiring and a slit defining a wiring missing portion in which the ground wiring is absent in the ground wiring is provided in the overlapped portion.

17 Claims, 10 Drawing Sheets

(56) References Cited

U.S. PATENT DOCUMENTS

| | | | |
|---|---|---|---|
| 8,138,854 B2* | 3/2012 | Hara | H03H 9/0028 |
| | | | 333/126 |
| 8,179,207 B2* | 5/2012 | Tanaka | H03H 9/0085 |
| | | | 333/133 |
| 9,455,682 B2* | 9/2016 | Kuzushita | H03H 9/0566 |
| 2009/0058555 A1* | 3/2009 | Takata | H03H 9/0576 |
| | | | 333/129 |
| 2012/0188026 A1 | 7/2012 | Yamaji et al. | |

* cited by examiner

ELASTIC WAVE APPARATUS

CROSS REFERENCE TO RELATED APPLICATIONS

This application claims the benefit of priority to Japanese Patent Application No. 2016-182870 filed on Sep. 20, 2016. The entire contents of this application are hereby incorporated herein by reference.

BACKGROUND OF THE INVENTION

1. Field of the Invention

The present invention relates to an elastic wave apparatus in which an elastic wave filter chip including first and second bandpass filters is mounted on a mounting substrate.

2. Description of the Related Art

Japanese Unexamined Patent Application Publication No. 2014-17537 discloses a duplexer that is used in an RF (Radio Frequency) stage of a cellular phone. The duplexer includes a transmission filter configured by an elastic wave filter having a ladder circuit configuration. In the elastic wave filter having the ladder circuit configuration, an inductor is connected between parallel arm resonators and a ground potential. The inductor is provided in a package substrate on which a duplexer chip is mounted.

Japanese Unexamined Patent Application Publication No. 2012-156741 discloses that a narrow pitch portion is provided in an elastic wave resonator of a ladder elastic wave filter. Isolation characteristics are improved by providing the narrow pitch portion.

An elastic wave filter apparatus in which one ends of a plurality of bandpass filters are commonly connected, such as a duplexer, is required to have preferable isolation characteristics. In the duplexer having the ladder elastic wave filter, which is disclosed in Japanese Unexamined Patent Application Publication No. 2014-17537, adjustment of an electrode shape as disclosed in Japanese Unexamined Patent Application Publication No. 2012-156741 is generally performed as a method for improving the isolation characteristics.

The adjustment of the electrode shape causes an increase in loss, however. Accordingly, it is difficult to achieve both of an improvement in the isolation characteristics and a decrease in the loss.

SUMMARY OF THE INVENTION

Preferred embodiments of the present invention provide elastic wave apparatuses capable of improving isolation characteristics without an increase in loss.

An elastic wave apparatus according to a preferred embodiment of the present invention includes a mounting substrate, and an elastic wave filter chip that is mounted on the mounting substrate, wherein the elastic wave filter chip includes first and second bandpass filters, the first bandpass filter being a ladder bandpass filter including series arm resonators and parallel arm resonators each of which is defined by an elastic wave resonator, the mounting substrate includes an inductor which is connected between at least one of the parallel arm resonators and a ground potential, a signal wiring which is provided at a different height position from the inductor in the mounting substrate and is connected to the first bandpass filter, and a ground wiring which is provided at an intermediate height position of the mounting substrate between the inductor and the signal wiring, and when the mounting substrate is viewed from a side of a surface on which the elastic wave filter chip is mounted, at least a portion of the inductor overlaps with the signal wiring and a wiring missing portion in which a portion of the ground wiring is absent in the ground wiring is provided in the overlapped portion.

In an elastic wave apparatus according to a preferred embodiment of the present invention, the wiring missing portion is preferably a slit. It is preferable that the overlapped portion has a lengthwise direction and a width direction, and that the slit crosses the overlapped portion in the width direction.

In an elastic wave apparatus according to another preferred embodiment of the present invention, the slit preferably has a polygonal or substantially polygonal planar shape.

In an elastic wave apparatus according to another preferred embodiment of the present invention, the slit preferably has an elliptical or substantially elliptical planar shape.

In an elastic wave apparatus according to another preferred embodiment of the present invention, a plurality of slits are preferably provided.

In an elastic wave apparatus according to another preferred embodiment of the present invention, the plurality of slits preferably include a first slit having a shape defined by combining a polygon or an approximate polygon and a portion of an ellipse or a substantial ellipse and a second slit having a remaining shape defined by removing the portion of the ellipse or approximate ellipse from the polygon or approximate polygon.

In an elastic wave apparatus according to another preferred embodiment of the present invention, the inductor is preferably provided on the surface of the mounting substrate on which the elastic wave filter chip is mounted.

In an elastic wave apparatus according to another preferred embodiment of the present invention, the inductor is preferably provided in the mounting substrate.

In an elastic wave apparatus according to another preferred embodiment of the present invention, the signal wiring is preferably provided on a surface of the mounting substrate at an opposite side to the surface on which the elastic wave filter chip is mounted.

In an elastic wave apparatus according to another preferred embodiment of the present invention, the first and second bandpass filters are preferably SAW (Surface Acoustic Wave) filters.

In an elastic wave apparatus according to another preferred embodiment of the present invention, one end of the first bandpass filter and one end of the second bandpass filter are preferably commonly connected in the elastic wave filter chip.

In an elastic wave apparatus according to another preferred embodiment of the present invention, the first bandpass filter is preferably a transmission filter and the second bandpass filter is preferably a reception filter.

According to various preferred embodiments of the present invention, elastic wave apparatuses capable of improving isolation characteristics without an increase in loss are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be made clear by describing specific preferred embodiments of the present invention with reference to the drawings.

It should be noted that the respective preferred embodiments which are described in the specification are exemplary and partial replacement or combination of configurations between different preferred embodiments may be made.

Figure 1A:
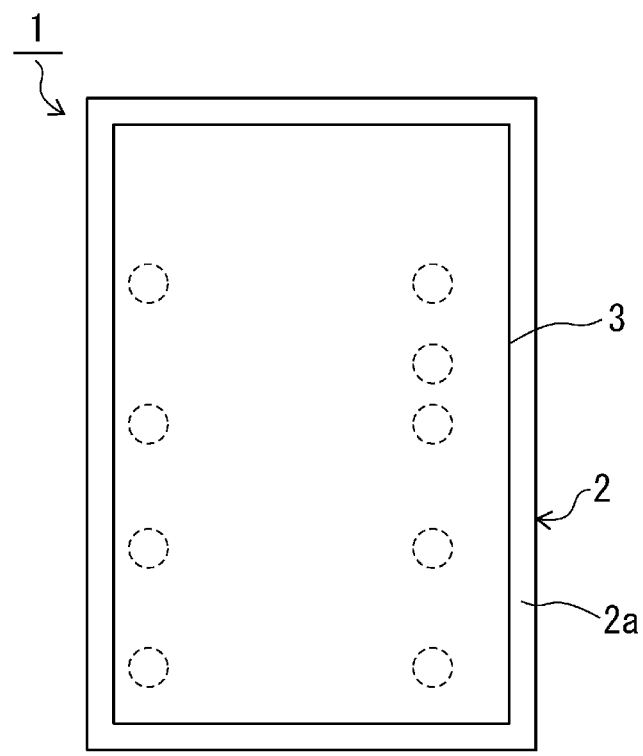
FIGS. 1A and 1B are a plan view and a front view of an elastic wave apparatus according to a first preferred embodiment of the present invention.
Figure 1B:
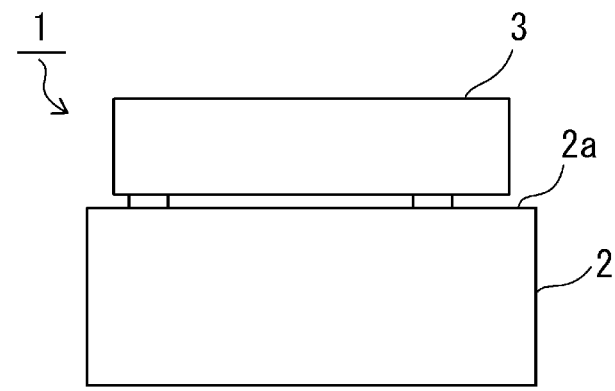

FIGS. 1A and 1B are a plan view and a front view of an elastic wave apparatus according to a first preferred embodiment of the present invention.

Figure 5:
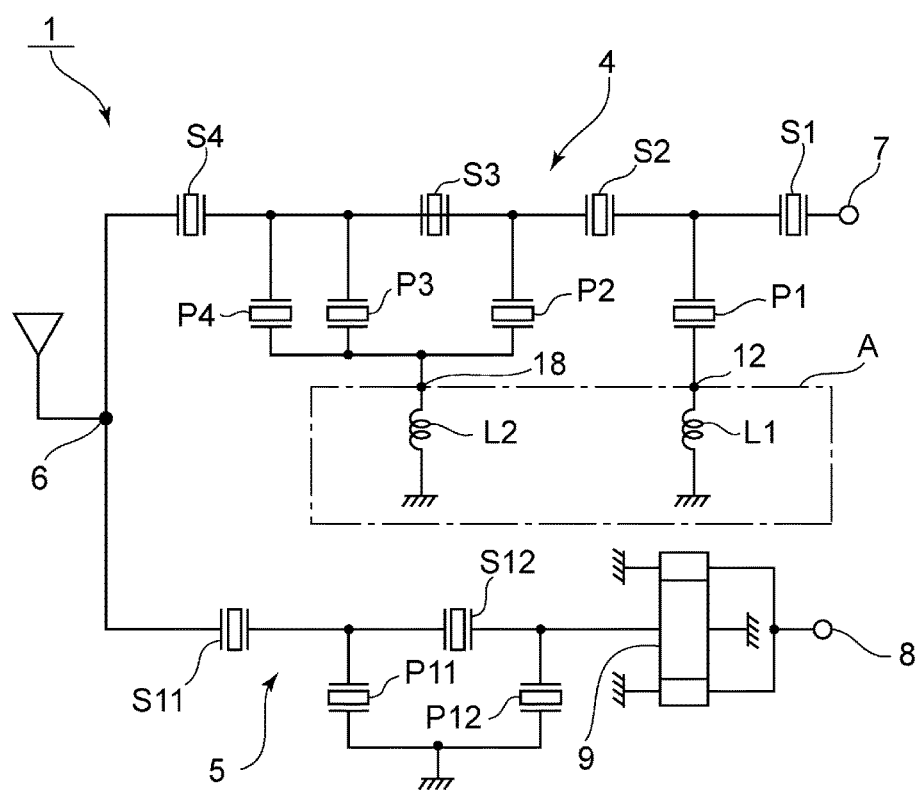
FIG. 5 is a circuit diagram of the elastic wave apparatus in the first preferred embodiment of the present invention.

An elastic wave apparatus 1 includes a mounting substrate 2, and an elastic wave filter chip 3 that is mounted on an upper surface 2a of the mounting substrate 2. FIG. 5 is a circuit diagram of the elastic wave apparatus 1. The elastic wave apparatus 1 is preferably a duplexer, for example. The elastic wave apparatus 1 includes a transmission filter 4 defining a first bandpass filter and a reception filter 5 defining a second bandpass filter. The transmission filter 4 is connected between an antenna terminal 6 and a transmission terminal 7. The reception filter 5 is connected between the antenna terminal 6 and a reception terminal 8. First ends of the transmission filter 4 and the reception filter 5 are commonly connected at the antenna terminal 6. The transmission filter 4 is a ladder bandpass filter including a plurality of series arm resonators S1 to S4 defined by elastic wave resonators and a plurality of parallel arm resonators P1 to P4 defined by elastic wave resonators. An inductor L1 is connected between the parallel arm resonator P1 and a ground potential. End portions of the parallel arm resonators P2 to P4 at the ground potential side are commonly connected. An inductor L2 is connected between the commonly-connected portion and the ground potential. As will be described later, the inductors L1 and L2 are provided in or on the mounting substrate 2. That is to say, a portion surrounded by dashed-dotted line A in FIG. 5 is provided in or on the mounting substrate 2. A remaining portion provided by removing the portion surrounded by dashed-dotted line A is provided in or on the elastic wave filter chip 3.

The pass band of the transmission filter 4 is adjusted by providing the inductors L1 and L2.

In preferred embodiments of the present invention, the circuit configuration of the first bandpass filter is not limited to that shown in FIG. 5 as long as it is the ladder bandpass filter including the series arm resonators and the parallel arm resonators defined by the elastic wave resonators and including the inductor connected between the parallel arm resonator and the ground potential on the mounting substrate side for band adjustment, similar to the above-described transmission filter 4.

The reception filter 5 includes series arm resonators S11 and S12, parallel arm resonators P11 and P12, and a longitudinally coupled resonator elastic wave filter 9.

The circuit configuration of the second bandpass filter is also not limited to that of the reception filter 5 shown in FIG. 5 and various bandpass filters may be used.

Figure 2A:
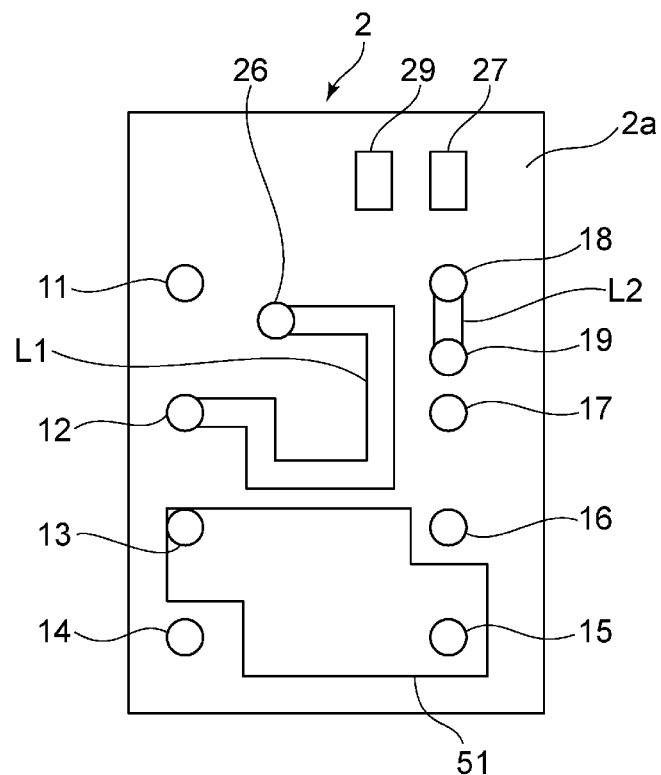
FIGS. 2A and 2B are a plan view of a mounting substrate included in the first preferred embodiment of the present invention and a plan view illustrating an electrode shape provided on an intermediate layer in the mounting substrate.
Figure 2B:
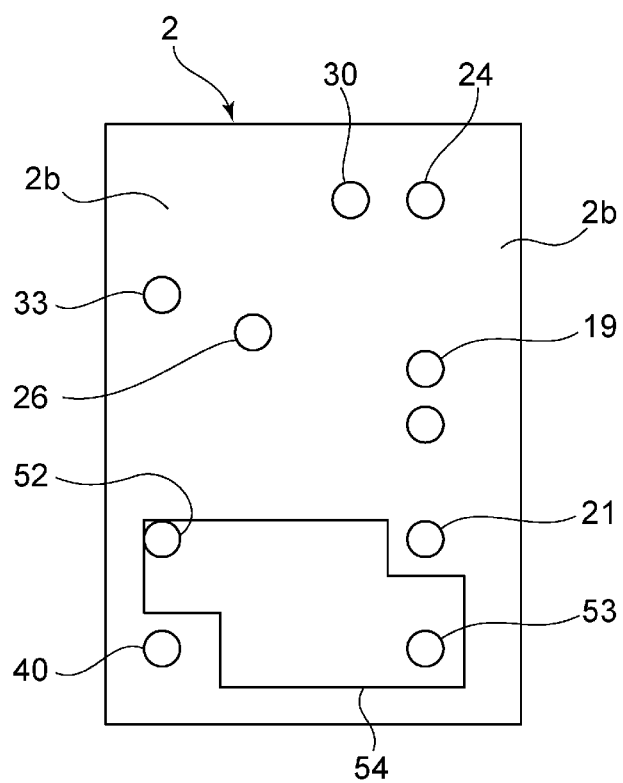
Figure 3A:
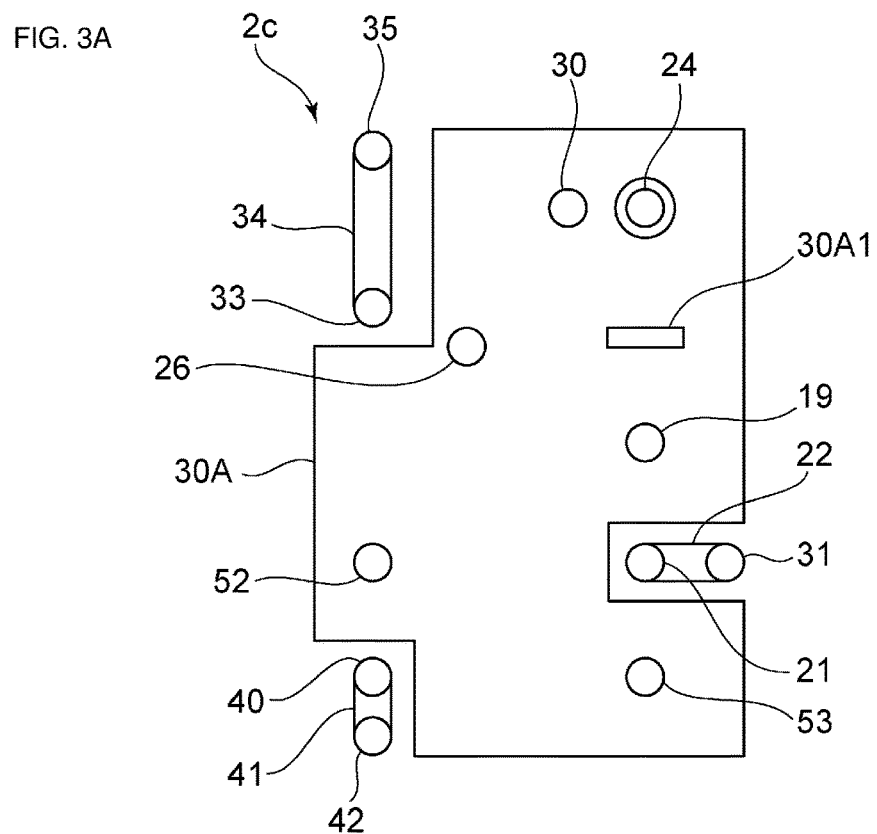
FIGS. 3A and 3B are a plan view illustrating an electrode shape provided on another intermediate layer located under the intermediate layer illustrated in FIG. 2B in the mounting substrate included in the first preferred embodiment of the present invention and a plan view illustrating an electrode shape provided on the lower surface of the mounting substrate.
Figure 3B:
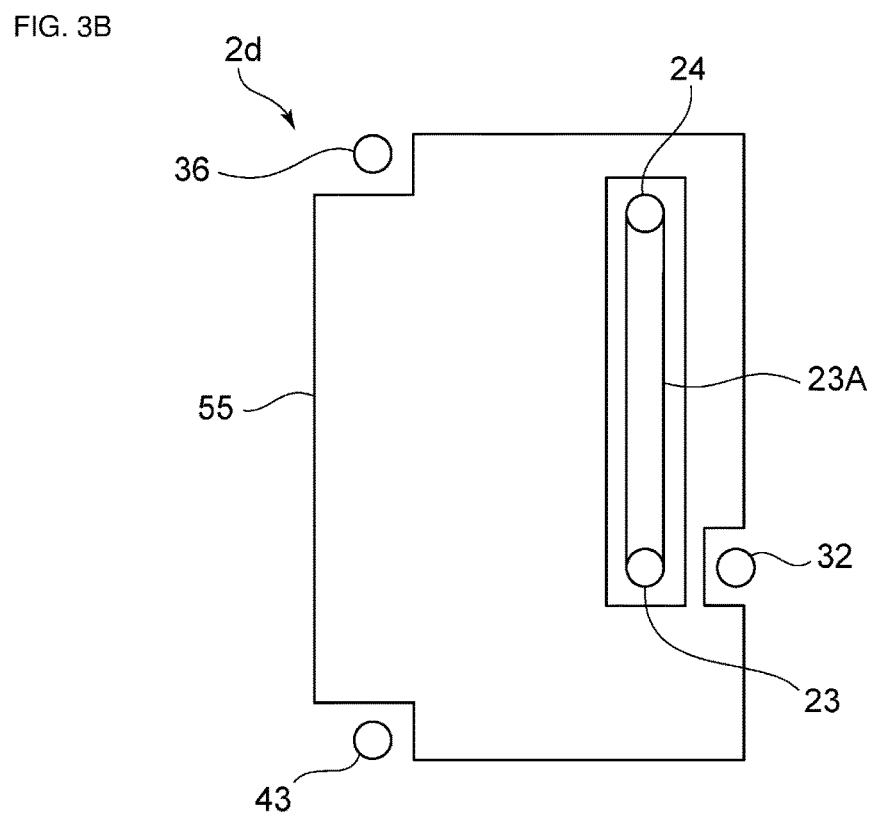

FIGS. 2A and 2B are a plan view of the mounting substrate included in the first preferred embodiment and a plan view showing an electrode shape provided on an intermediate layer in the mounting substrate. FIGS. 3A and 3B are a plan view showing an electrode shape provided on another intermediate layer located under the intermediate layer illustrated in FIG. 2B and a plan view showing an electrode shape provided on the lower surface of the mounting substrate.

As illustrated in FIG. 2A, first to eighth terminals 11 to 18 are provided on the upper surface 2a of the mounting substrate 2. The first to eighth terminals 11 to 18 are electrically connected to predetermined terminal electrodes of the elastic wave filter chip 3. The antenna terminal 6 of the elastic wave filter chip 3 is connected to the sixth terminal 16. A via hole electrode 21 illustrated in FIG. 2B is connected to the lower surface of the sixth terminal 16. The via hole electrode 21 penetrates through the mounting substrate 2 in the up-down direction as illustrated in FIG. 3A and is connected to a connection electrode 23 indicated by a circular or substantially circular shape in FIG. 3B.

Furthermore, a connection electrode 22 provided on the intermediate layer illustrated in FIG. 3A is provided in the via hole electrode 21. The connection electrode 22 is connected to a via hole electrode 31. The via hole electrode 31 extends downward and is connected to an external terminal 32 illustrated in FIG. 3B. The external terminal 32 is a portion that is connected to the antenna terminal 6.

Returning to FIG. 3B, a linearly elongated connection electrode 23A is connected to the connection electrode 23 on a lower surface 2d of the mounting substrate 2. A via hole electrode 24 is connected to another end of the connection electrode 23A. The via hole electrode 24 extends upward from the lower surface 2d of the mounting substrate 2. That is to say, as illustrated in FIG. 3A and FIG. 2B, the via hole electrode 24 extends upward and is connected to a terminal 27 illustrated in FIG. 2A. A terminal 29 is provided on the upper surface 2a of the mounting substrate 2 so as to oppose the terminal 27. Although not specifically illustrated in the drawings, an inductor that provides impedance matching with an antenna is outside-mounted between the terminal 27 and the terminal 29.

A via hole electrode 30 illustrated in FIG. 2B is electrically connected to the lower surface of the terminal 29. The via hole electrode 30 is electrically connected to a ground wiring 30A, as illustrated in FIG. 3A.

The first terminal 11 illustrated in FIG. 2A is connected to the transmission terminal 7. A via hole electrode 33 is connected to the lower surface of the first terminal 11. The via hole electrode 33 extends downward and is electrically connected to a connection electrode 34 as illustrated in FIG. 2B and FIG. 3A. A via hole electrode 35 is connected to another end of the connection electrode 34. The via hole electrode 35 is connected to a transmission output terminal 36 illustrated in FIG. 3B.

The second terminal 12 is a terminal that is connected to the parallel arm resonator P1 in the portion surrounded by dashed-dotted line A in FIG. 5. The inductor L1 is connected between the second terminal 12 and the ground potential. As illustrated in FIG. 2A, the inductor L1 is provided by routing a conductor pattern. That is to say, the conductor pattern extends so as to have an inductance value and to define the inductor L1. A via hole electrode 26 is connected to another end of the inductor L1. The via hole electrode 26 extends downward and is electrically connected to the ground wiring 30A as illustrated in FIG. 3A.

The eighth terminal 18 is a terminal that is connected to the commonly-connected point of the parallel arm resonators P2 to P4 as illustrated in FIG. 5. The inductor L2 is connected between the eighth terminal 18 and the ground potential. As illustrated in FIG. 2A, the inductor L2 defined by a linear conductor pattern is connected to the eighth terminal 18. A via hole electrode 19 is connected to an end portion of the inductor L2. The via hole electrode 19 extends downward as illustrated in FIG. 2B and is connected to the ground wiring 30A illustrated in FIG. 3A.

A reception terminal of the elastic wave filter chip 3 is connected to the fourth terminal 14. A via hole electrode 40 illustrated in FIG. 2B is connected to the lower surface of the fourth terminal 14 illustrated in FIG. 2A. The via hole electrode 40 is connected to a connection electrode 41 illustrated in FIG. 3A. A via hole electrode 42 is connected to the lower surface of the connection electrode 41. The via hole electrode 42 is connected to an output terminal 43 illustrated in FIG. 3B.

Terminals of the reception filter 5, which are connected to the ground potential, are connected to the third terminal 13 and the fifth terminal 15. The third terminal 13 and the fifth terminal 15 are connected to a shield electrode 51 provided on the upper surface 2a of the mounting substrate 2. The shield electrode 51 has a relatively large area as illustrated in the drawing. Via hole electrodes 52 and 53 are connected to the lower surfaces of the third terminal 13 and the fifth terminal 15, respectively. As illustrated in FIG. 2B, a shield electrode 54 having a relatively large area is also provided on an intermediate layer 2b. The via hole electrodes 52 and 53 are connected to the shield electrode 54. The via hole electrodes 52 and 53 further extend downward from the intermediate layer 2b and are connected to the ground wiring 30A on an intermediate layer 2c illustrated in FIG. 3A. The via hole electrodes 19, 30, 26, 52, and 53 penetrate through the ground wiring 30A and are electrically connected to a ground wiring 55 provided on further the lower surface 2d.

The elastic wave filter chip 3 is mounted on the mounting substrate 2 so as to provide the circuit as illustrated in FIG. 5.

In the mounting substrate 2, the inductor L2 overlaps with a signal wiring at the hot side, which is defined by the connection electrode 23A, with the ground wiring 30A provided on the intermediate layer 2c interposed therebetween. That is to say, when the mounting substrate 2 is viewed from the side of the upper surface 2a as the surface on which the elastic wave filter chip 3 is mounted, at least a portion of the inductor L2 overlaps with the connection electrode 23A defining the signal wiring. A slit 30A1 defining a wiring missing portion in which the ground wiring is absent in the ground wiring 30A is provided in the overlapped portion.

It should be noted that in the present preferred embodiment, the overlapped portion has a lengthwise direction and a width direction. The slit 30A1 preferably crosses the overlapped portion in the above-described width direction. However, the wiring missing portion may extend in the direction other than the width direction of the overlapped portion.

Figure 4:
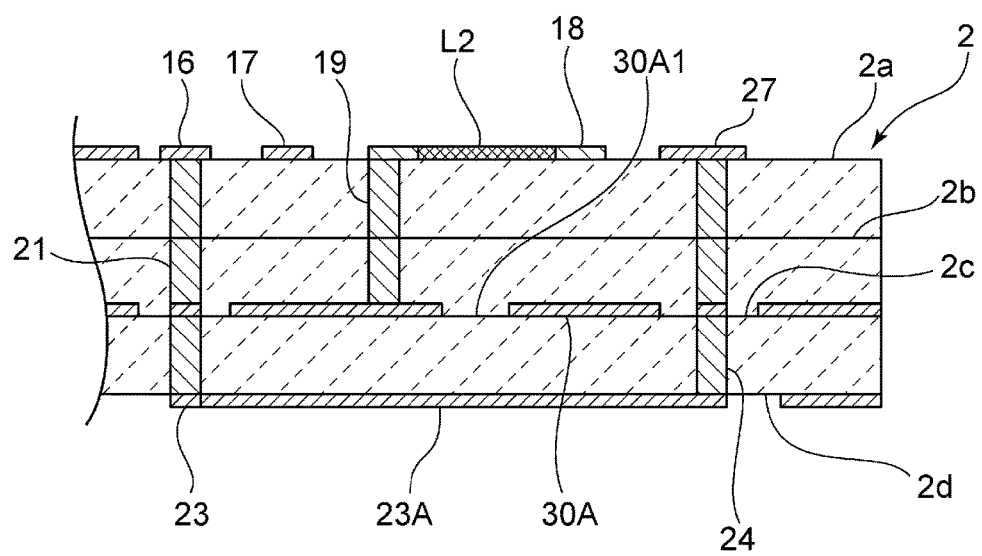
FIG. 4 is a partially cut-out cross-sectional side view illustrating a main portion of the mounting substrate included in the first preferred embodiment of the present invention.

FIG. 4 is a partially cut-out cross-sectional side view of the mounting substrate 2, which illustrates a portion in which the slit 30A1 is provided. Accordingly, the degree of electromagnetic field coupling between the inductor L2 and the connection electrode 23A as the signal wiring at the hot side is able to be adjusted by providing the above-described slit 30A1.

In the elastic wave apparatus 1 in the present preferred embodiment, the slit 30A1 defining the above-described wiring missing portion is preferably provided in the transmission filter 4 to adjust the degree of electromagnetic field coupling and the isolation characteristics are therefore improved.

The characteristics are described with reference to FIG. 6 and FIG. 7.

The elastic wave apparatus 1 preferably is a duplexer that is preferably used in Band 26. A reception band of Band 26 is about 859 MHz to about 894 MHz and a transmission band thereof is about 814 MHz to about 849 MHz, for example.

Design parameters of the transmission filter in an example of the above-described first preferred embodiment are as follows.

(1) The numbers of pairs of electrode fingers of IDT (Interdigital Transducer) electrodes, electrode finger pitches, intersecting widths, duties, and the numbers of electrode fingers of reflectors in the series arm resonators S1 to S4 were set as shown in Table 1.

TABLE 1

|  | SERIES ARM RESONATOR | | | |
| --- | --- | --- | --- | --- |
|  | S1 | S2 | S3 | S4 |
| NUMBER OF PAIRS OF IDT ELECTRODE FINGERS | 94 | 41 | 72 | 66 |
| ELECTRODE FINGER PITCH (μm) | 4.441 | 4.414 | 4.366 | 4.429 |
| INTERSECTING WIDTH (μm) | 47 | 75.8 | 79.4 | 84 |
| DUTY | 0.5 | 0.5 | 0.5 | 0.5 |
| NUMBER OF ELECTRODE FINGERS OF REFLECTOR | 14 | 15 | 12 | 15 |

(2) The numbers of pairs of electrode fingers of IDT electrodes, electrode finger pitches, intersecting widths, duties, and the numbers of electrode fingers of reflectors in the parallel arm resonators P1 to P4 were set as in Table 2.

TABLE 2

| | PARALLEL ARM RESONATOR | | | |
|---|---|---|---|---|
| | P1 | P2 | P3 | P4 |
| NUMBER OF PAIRS OF IDT ELECTRODE FINGERS | 148 | 57 | 88 | 88 |
| ELECTRODE FINGER PITCH (µm) | 4.67 | 4.613 | 4.621 | 4.621 |
| INTERSECTING WIDTH (µm) | 93.2 | 90 | 92.8 | 92.8 |
| DUTY | 0.5 | 0.5 | 0.5 | 0.5 |
| NUMBER OF ELECTRODE FINGERS OF REFLECTOR | 14 | 14 | 14 | 14 |

(3) The inductance values of the inductor L1 and the inductor L2 were set as follows.

L1=about 0.5 nH, L2=about 0.1 nH (4) Size of Slit 30A1

The size of the slit 30A1 was set to have a rectangular or substantially rectangular shape of about 300 µm×about 100 µm as a planar shape.

Figure 6:
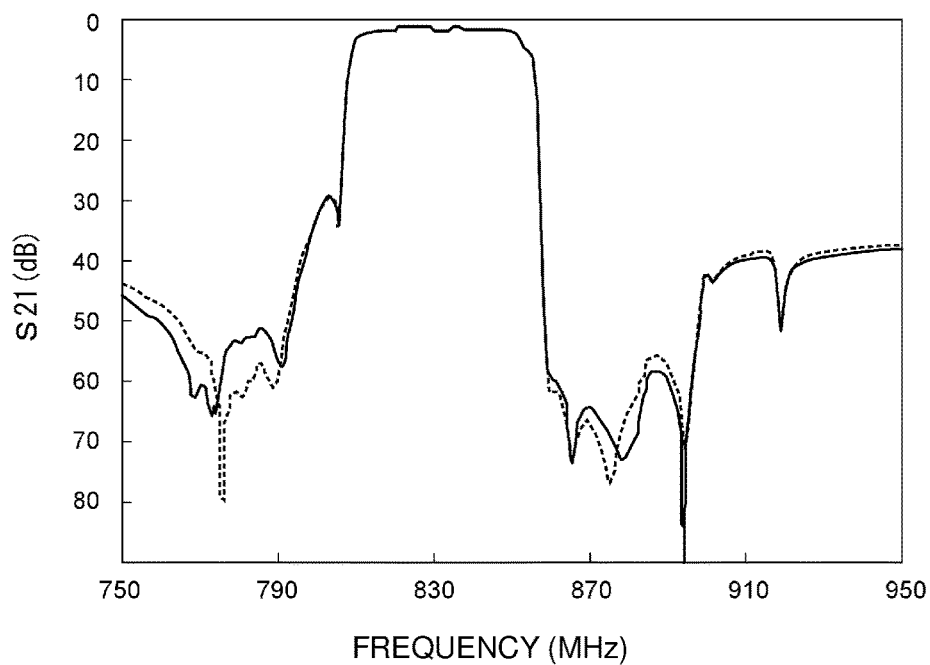
FIG. 6 is a graph illustrating bandpass characteristics S21 in the first preferred embodiment of the present invention and a comparative example.
Figure 7:
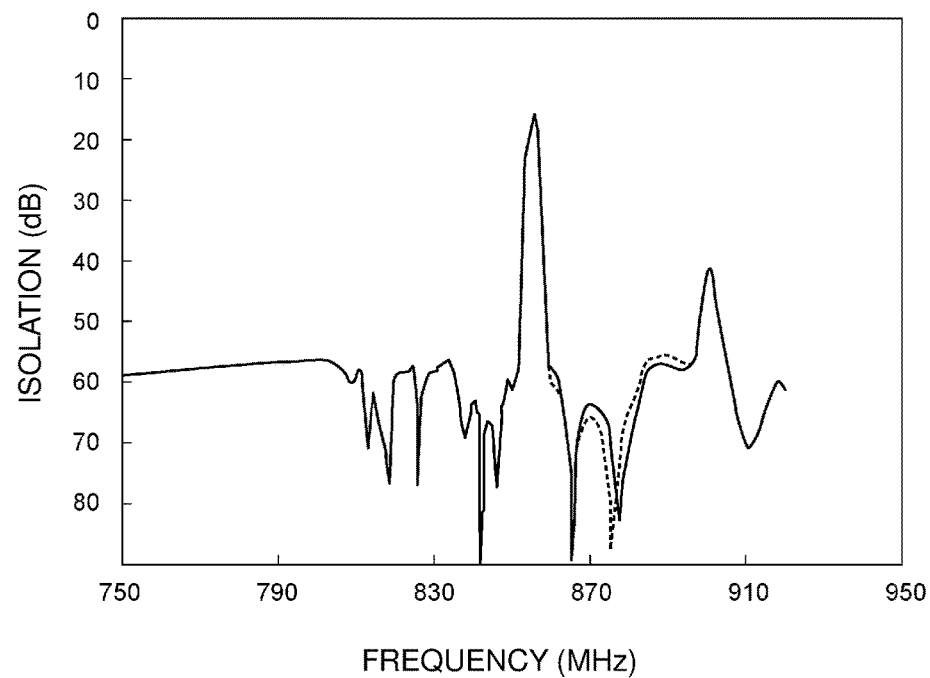
FIG. 7 is a graph illustrating isolation characteristics in the first preferred embodiment of the present invention and the comparative example.

FIG. 6 illustrates bandpass characteristics S21 of the transmission filter 4 in the elastic wave apparatus 1 and FIG. 7 illustrates isolation characteristics thereof. Solid lines indicate results in the example of the above-described first preferred embodiment and dashed lines indicate characteristics in a comparative example which is configured in the same or substantially the same manner as the example, except that the above-described slit 30A1 is not provided.

In FIG. 6 and FIG. 7, it is shown that the attenuation and the isolation characteristics in about 859 MHz to about 894 MHz as the reception band of Band 26 are larger in the results indicated by the solid lines than those indicated by the dashed lines. To be more specific, FIG. 6 and FIG. 7 indicate that in the above-described reception band, both of the attenuation and the isolation characteristics are greater in the example than in the comparative example in a peak portion with the worst bandpass characteristics and a portion with the worst isolation characteristics. Accordingly, the isolation characteristics are improved by providing the slit 30A1.

In the elastic wave apparatus 1, an increase in loss is also unlikely to occur because the isolation characteristics are improved by providing the above-described slit 30A1.

Figure 8:
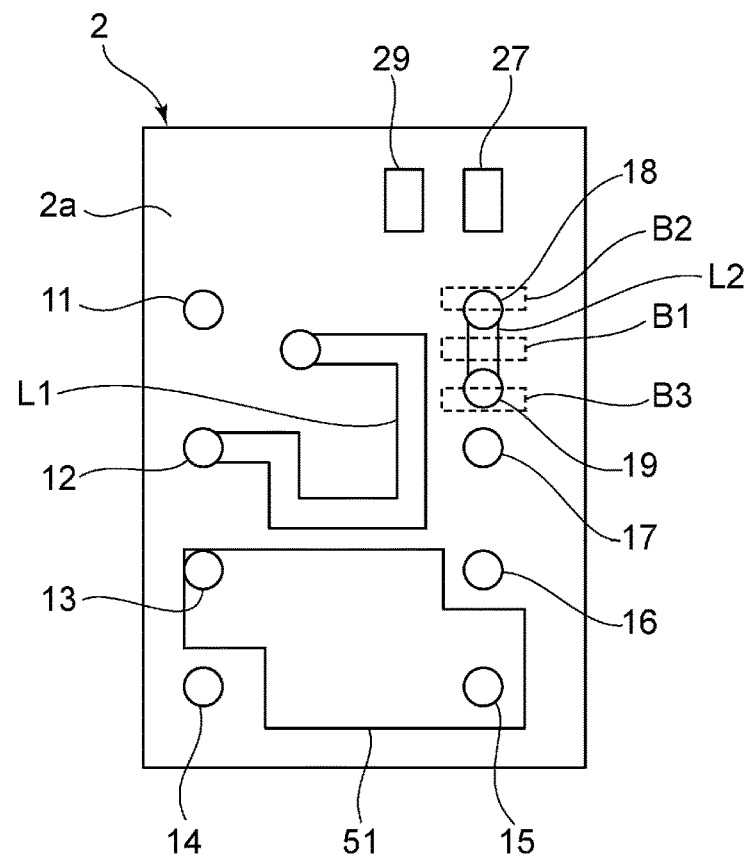
FIG. 8 is a plan view of the mounting substrate to explain a state in which a position of a slit is changed in an example of the first preferred embodiment of the present invention.

Next, in the above-described example of the elastic wave apparatus 1, the position of the slit 30A1 was changed to those as indicated by dashed lines B1 to B3 in FIG. 8. The dashed line B1 indicates the case in which the slit 30A1 was provided so as to cross the above-described overlapped portion in the width direction at the center or approximate center of the inductor L2 in the lengthwise direction. The dashed lines B2 and B3 indicate the cases in which the slit 30A1 was provided so as to cross the overlapped portion in the width direction at end portions of the overlapped portion in the lengthwise direction.

Figure 9:
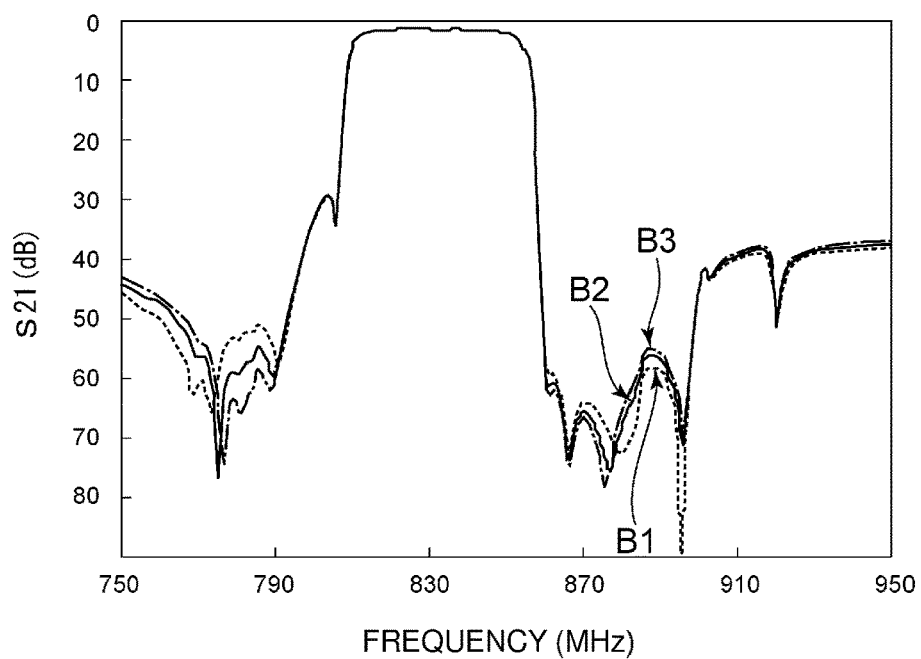
FIG. 9 is a graph illustrating the bandpass characteristics S21 when the position of the slit is changed as illustrated in FIG. 8.

FIG. 9 is a graph illustrating the bandpass characteristics S21 when the slit 30A1 was provided at each of the positions indicated by the dashed lines B1 to B3. A dashed line in FIG. 9 indicates the characteristics when the slit 30A1 was provided at the position indicated by the dashed line B1. A solid line and a dashed-dotted line in FIG. 9 indicate the characteristics when the slit 30A1 was provided at the positions indicated by the dashed lines B2 and B3, respectively.

As shown in FIG. 9, the attenuation in the reception band was increased when the slit 30A1 was provided at the position indicated by the dashed line B1 at the center or approximate center of the overlapped portion. Accordingly, it is preferable that the slit 30A1 be provided in the overlapped portion at the center or approximate center rather than at the end portions in the lengthwise direction.

Figure 10:
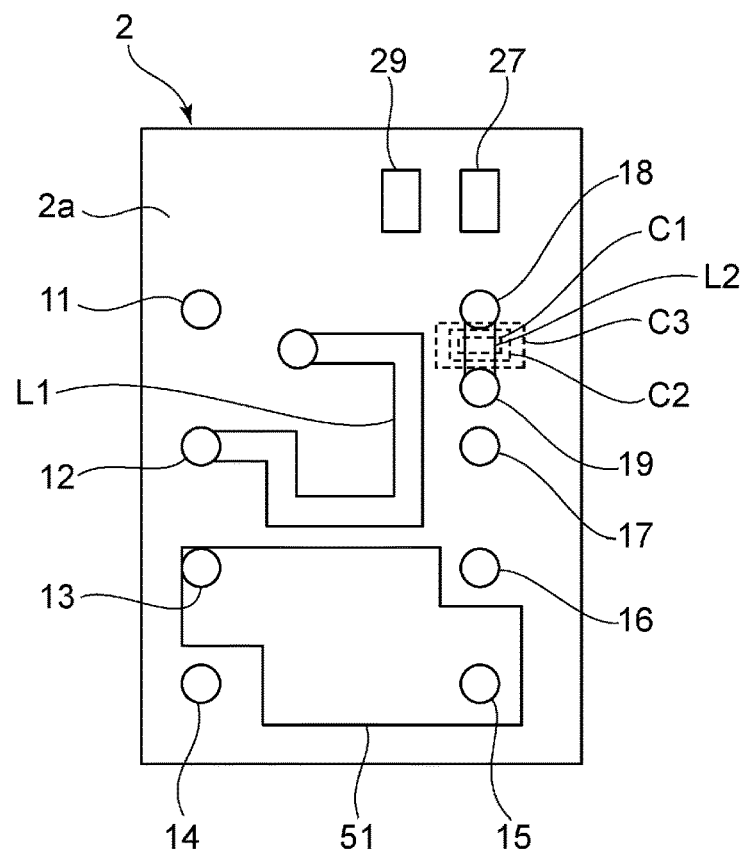
FIG. 10 is a plan view of the mounting substrate to explain the position of the slit when a size of the slit is changed in an experimental example of the elastic wave apparatus in the first preferred embodiment of the present invention.

Next, the size of the slit 30A1 was changed to those as indicated by dashed lines C1 to C3 in FIG. 10. The size of the slit was set as follows.

C1: Substantially rectangular shape of about 200 µm×about 100 µm

C2: Substantially rectangular shape of about 250 µm×about 150 µm

C3: Substantially rectangular shape of about 300 µm×about 200 µm

Other configurations were the same or substantially the same as those in the above-described example.

Figure 11:
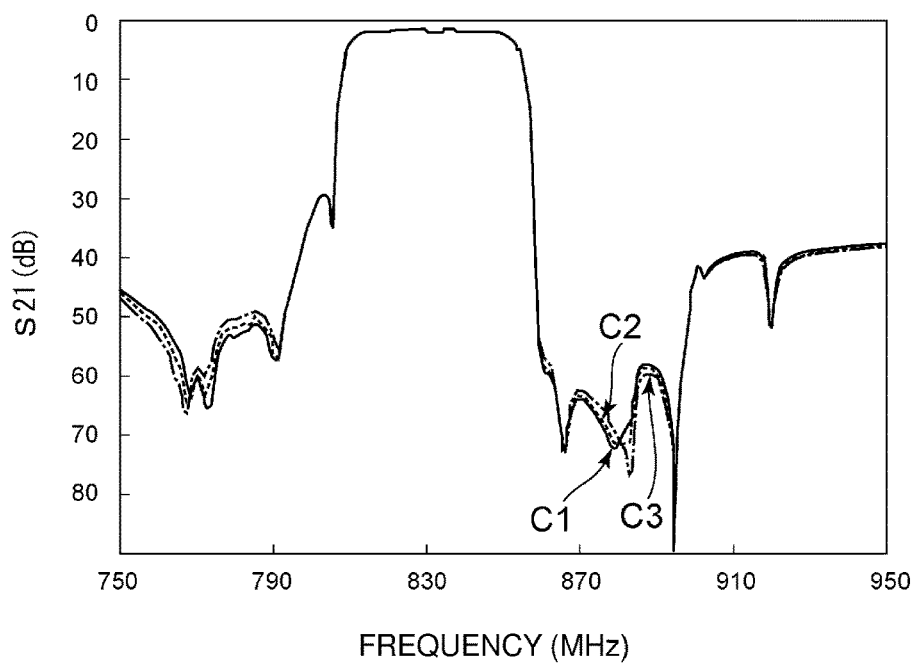
FIG. 11 is a graph illustrating the bandpass characteristics S21 when the size of the slit is changed as illustrated in FIG. 10.

FIG. 11 is a graph illustrating the bandpass characteristics S21 when the size of the slit 30A1 was changed as described above. In FIG. 11, a solid line indicates a result in the case of the dashed line C1, a dashed line indicates a result in the case of the dashed line C2, and a dashed-dotted line indicates a result in the case of the dashed line C3. Accordingly, it is discovered that in the case of the dashed line C3 when the slit 30A1 is the largest, the attenuation in the reception band is sufficiently increased.

It is therefore preferable that the slit 30A1 have a relatively large area in the overlapped portion.

Figure 12:
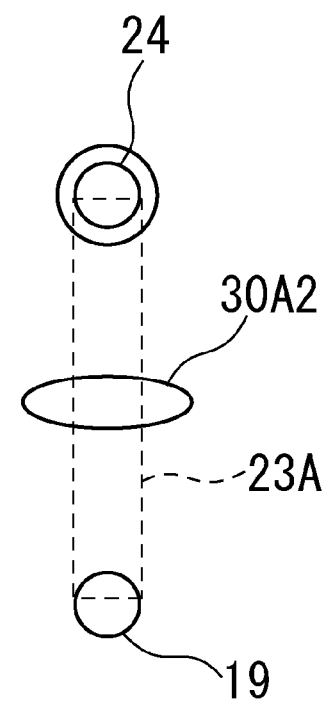
FIG. 12 is a schematic plan view to explain a variation on the slit.
Figure 13:
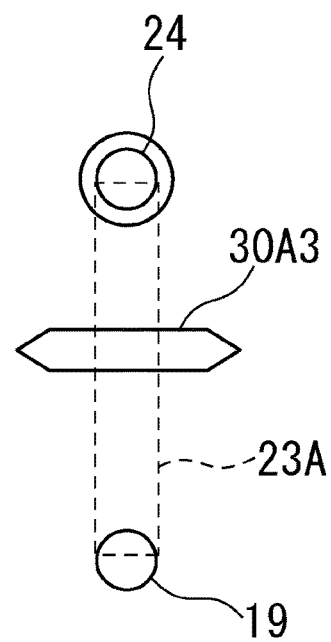
FIG. 13 is a schematic plan view to explain another variation on the slit.

Although the slit 30A1 having the rectangular or substantially rectangular planar shape is preferably provided in the elastic wave apparatus 1, the wiring missing portion in preferred embodiments of the present invention may not have the slit shape or approximately slit shape. Furthermore, as the slit shape or approximately slit shape, an elliptical or substantially elliptical slit 30A2 may preferably be provided as illustrated in FIG. 12. Moreover, a polygonal or substantially polygonal shaped slit 30A3 may preferably be provided as illustrated in FIG. 13. The shape of the polygonal or substantially polygonal shape is also not limited to that illustrated in the drawing.

Figure 14:
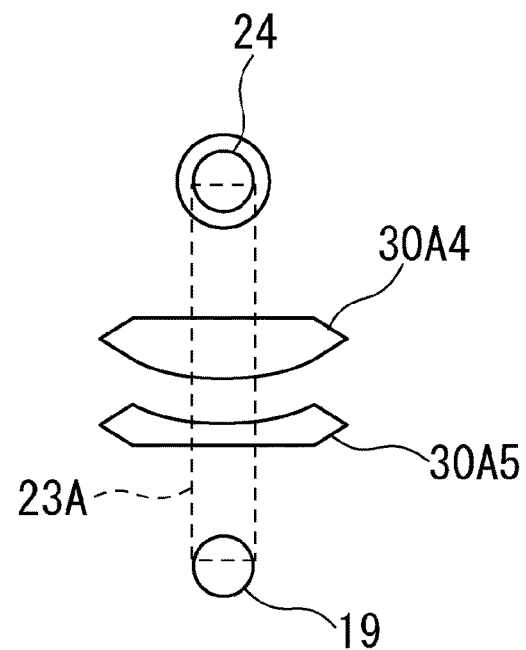
FIG. 14 is a schematic plan view to explaining another variation on the slit.

As illustrated in FIG. 14, a plurality of first and second slits 30A4 and 30A5 may preferably be provided. In FIG. 14, the first slit 30A4 has a shape defined by combining a polygon or approximate polygon and a portion of an ellipse or approximate ellipse and the second slit 30A5 has a remaining shape of removing the portion of the above-described ellipse or approximate ellipse from the polygon or approximate polygon.

A space may be effectively utilized by further changing the shapes by providing the plurality of slits. Therefore, a reduction in size is able be achieved.

Although the duplexer is provided in the elastic wave apparatus 1, preferred embodiments of the present invention may be widely applied to elastic wave apparatuses having a configuration in which the first bandpass filter and the second bandpass filter are commonly connected at one end side. Accordingly, in addition to the first and second bandpass filters, another bandpass filter may preferably be commonly connected at the one end side. Furthermore, although the elastic wave resonators are defined by SAW resonators, elastic wave resonators using BAW (Bulk Acoustic Wave) resonators may preferably be used. That is to say, the first bandpass filter may be defined by the BAW filter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave apparatus comprising:
   a mounting substrate; and
   an elastic wave filter chip that is mounted on the mounting substrate; wherein
   the elastic wave filter chip includes first and second bandpass filters, the first bandpass filter being a ladder bandpass filter including series arm resonators and parallel arm resonators each of which is defined by an elastic wave resonator;
   the mounting substrate includes an inductor which is connected between at least one of the parallel arm resonators and a ground potential, a signal wiring which is provided at a different height position from the inductor in the mounting substrate and is connected to the first bandpass filter, and a ground wiring which is provided at an intermediate height position of the mounting substrate between the inductor and the signal wiring; and
   when the mounting substrate is viewed from a side of a surface on which the elastic wave filter chip is mounted, at least a portion of the inductor overlaps with the signal wiring and a wiring missing portion in which a portion of the ground wiring is absent from the ground wiring is located in the overlapped portion.

2. The elastic wave apparatus according to claim 1, wherein the wiring missing portion is a slit.

3. The elastic wave apparatus according to claim 2, wherein the overlapped portion has a length direction and a width direction, and the slit crosses the overlapped portion in the width direction.

4. The elastic wave apparatus according to claim 2, wherein the slit has a polygonal or substantially polygonal planar shape.

5. The elastic wave apparatus according to claim 2, wherein the slit has an elliptical or substantially elliptical planar shape.

6. The elastic wave apparatus according to claim 2, wherein a plurality of the slits are provided.

7. The elastic wave apparatus according to claim 6, wherein the plurality of slits include a first slit having a shape defined by combining a polygon or approximate polygon and a portion of an ellipse or approximate ellipse and a second slit having a shape defined by removing the portion of the ellipse or approximate ellipse from the polygon or approximate polygon.

8. The elastic wave apparatus according to claim 1, wherein the inductor is provided on the surface of the mounting substrate on which the elastic wave filter chip is mounted.

9. The elastic wave apparatus according to claim 1, wherein the inductor is provided in the mounting substrate.

10. The elastic wave apparatus according to claim 1, wherein the signal wiring is provided on a surface of the mounting substrate at an opposite side to the surface on which the elastic wave filter chip is mounted.

11. The elastic wave apparatus according to claim 1, wherein the first and second bandpass filters are surface acoustic wave filters.

12. The elastic wave apparatus according to claim 1, wherein one end of the first bandpass filter and one end of the second bandpass filter are commonly connected in the elastic wave filter chip.

13. The elastic wave apparatus according to claim 12, wherein the first bandpass filter is a transmission filter and the second bandpass filter is a reception filter.

14. The elastic wave apparatus according to claim 13, further comprising another inductor; wherein
   the another inductor is connected between another at least one of the parallel arm resonators and the ground potential.

15. The elastic wave apparatus according to claim 14, wherein the inductor and the another inductor adjust the pass band of the transmission filter.

16. The elastic wave apparatus according to claim 14, wherein the inductor includes a linear conductor pattern.

17. The elastic wave apparatus according to claim 13, wherein the reception filter is connected to the ground potential via at least one shield electrode.

* * * * *